(12) United States Patent
Ushijima

(10) Patent No.: US 6,870,253 B1
(45) Date of Patent: Mar. 22, 2005

(54) POWER SEMICONDUCTOR DEVICE

(75) Inventor: Koichi Ushijima, Hyogo (JP)

(73) Assignees: Mitsubishi Denki Kabushiki Kaisha, Tokyo (JP); Renesas Device Design Corporation, Itami (JP)

( * ) Notice: Subject to any disclaimer, the term of this patent is extended or adjusted under 35 U.S.C. 154(b) by 0 days.

(21) Appl. No.: 10/790,705

(22) Filed: Mar. 3, 2004

(30) Foreign Application Priority Data

Sep. 5, 2003 (JP) ...................................... 2003-313523

(51) Int. Cl.[7] ............................................. H01L 23/52
(52) U.S. Cl. ....................... 257/691; 361/611; 361/624; 361/639
(58) Field of Search ............................... 257/691, 578; 361/611, 624, 637, 639

(56) References Cited

FOREIGN PATENT DOCUMENTS

| JP | 10-209197 | 8/1998 |
| JP | 11-299239 | 10/1999 |
| JP | 2000-23462 | 1/2000 |

*Primary Examiner*—Eddie Lee
*Assistant Examiner*—Douglas W. Owens
(74) *Attorney, Agent, or Firm*—Oblon, Spivak, McClelland, Maier & Neustadt, P.C.

(57) ABSTRACT

Emitter electrodes (Es) and collector electrodes (Cs) of elements (101 to 104) are connected to bus electrodes (361 to 364) of a bus bar (351), respectively. The bus bar (351) contains seven layers including four insulating layers (not shown) and three conductive layers (shown) interposed between the insulating layers. Namely, each of the bus electrodes (361 to 364) is connected to one of the conductive layers corresponding to one of a positive electrode (P), a negative electrode (N) and an intermediate electrode (L). The collector electrodes (Cs) of the elements (103 and 104) are connected one over the other to the bus electrode (361). The emitter electrodes (Es) of the elements (103 and 104) are connected one over the other to the bus electrode (362). The collector electrodes (Cs) of the elements (101 and 102) are connected one over the other to the bus electrode (363). The emitter electrodes (Es) of the elements (101 and 102) are connected one over the other to the bus electrode (364).

12 Claims, 8 Drawing Sheets

POWER SEMICONDUCTOR DEVICE

BACKGROUND OF THE INVENTION

1. Field of the Invention

The present invention relates to a power semiconductor device, and more particularly to a technique of connecting switching elements in parallel which are sealed with resin by the transfer mold process and the like in a power control device and the like.

2. Description of the Background Art

In general, a power semiconductor element including one switching element (a MOS-FET, a bipolar transistor, an IGBT and the like) which is sealed with resin by the transfer mold process and the like is termed a 1 in 1 type power module. A power conversion device, typically a conventional inverter or converter having the 1 in 1 type power module and a control circuit thereof within, has presented the following problem: namely, a semiconductor substrate and the like included in the control circuit is subjected to strong noise and electromagnetic waves generated by a wiring inductance at the time of switching of the switching element, resulting in a malfunction or a breakdown of the power conversion device.

Another problem with the conventional power conversion device is an increase in the overall packaging area because of a wiring bus bar mounted outside the sealing resin.

Japanese Patent Application Laid-Open No. 11-299239 (1999), 2000-023462 and 10-209197 (1998) give examples of power conversion devices so designed in length, shape and the like of a wiring that they reduce the wiring inductance.

The structures of the above power conversion devices are not necessarily premised on the use of the 1 in 1 type power module as a power module. Those are thus less-than-optimal structures when they are premised on the use of the 1 in 1 type power module, leaving problems from the viewpoints of wiring inductance, packaging area and the like.

SUMMARY OF THE INVENTION

It is an object of the present invention to provide a power conversion device with a reduced wiring inductance and packaging area.

A power semiconductor device according to a first aspect of the present invention includes a first resin-sealed switching element, a second resin-sealed switching element, a third resin-sealed switching element, a fourth resin-sealed switching element and a bus bar. The first resin-sealed switching element includes a first gate electrode, a first emitter electrode and a first collector electrode. The second resin-sealed switching element includes a second gate electrode, a second emitter electrode and a second collector electrode. The third resin-sealed switching element includes a third gate electrode, a third emitter electrode and a third collector electrode. The fourth resin-sealed switching element includes a fourth gate electrode, a fourth emitter electrode and a fourth collector electrode. First to fourth bus electrodes are provided in this order on the bus bar. The first resin-sealed switching element and the second resin-sealed switching element are arranged to face each other with the bus bar therebetween, and the third resin-sealed switching element and the fourth resin-sealed switching element are arranged to face each other with the bus bar therebetween. The first collector electrode and the second collector electrode are connected one over the other with the first bus electrode. The first emitter electrode and the second emitter electrode are connected one over the other with the second bus electrode. The third collector electrode and the fourth collector electrode are connected one over the other with the third bus electrode. The third emitter electrode and the fourth emitter electrode are connected one over the other with the fourth bus electrode.

The number of the bus electrodes becomes fewer and the bus bar correspondingly gets shorter. Therefore, the wiring length thereby shortened allows a reduction of the wiring inductance. Moreover, since the bus bar is arranged between the elements, a packaging area can be reduced.

A power semiconductor device according to a second aspect of the present invention includes a first resin-sealed switching element, a second resin-sealed switching element, a third resin-sealed switching element, a fourth resin-sealed switching element, a bus bar and a resin. The first resin-sealed switching element includes a first gate electrode, a first emitter electrode and a first collector electrode. The second resin-sealed switching element includes a second gate electrode, a second emitter electrode and a second collector electrode. The third resin-sealed switching element includes a third gate electrode, a third emitter electrode and a third collector electrode. The fourth resin-sealed switching element includes a fourth gate electrode, a fourth emitter electrode and a fourth collector electrode. First to fourth bus electrodes are provided in this order on the bus bar. The resin seals the first to fourth resin-sealed switching elements and the bus bar together. The first resin-sealed switching element and the second resin-sealed switching element are arranged to face each other with the bus bar therebetween, and the third resin-sealed switching element and the fourth resin-sealed switching element are arranged to face each other with the bus bar therebetween. The first collector electrode and the second collector electrode are connected one over the other with the first bus electrode. The first emitter electrode and the second emitter electrode are connected one over the other with the second bus electrode. The third collector electrode and the fourth collector electrode are connected one over the other with the third bus electrode. The third emitter electrode and the fourth emitter electrode are connected one over the other with the fourth bus electrode.

The insulating property may be enhanced by sealing the first to fourth resin-sealed switching elements and the bus bar together.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

A power semiconductor device (power conversion device) according to a first preferred embodiment of the present invention features a reduction in length of a bus bar and packaging area, by arranging two power module elements each on both sides of the bus bar rather than arranging four power module elements on one side of the bus bar. Namely, the elements arranged in twos face each other with the bus bar between.

First, as a background to the present preferred embodiment, a configuration of a conventional power conversion device will now be described with reference to FIGS. 1 to 3.

Figure 1:
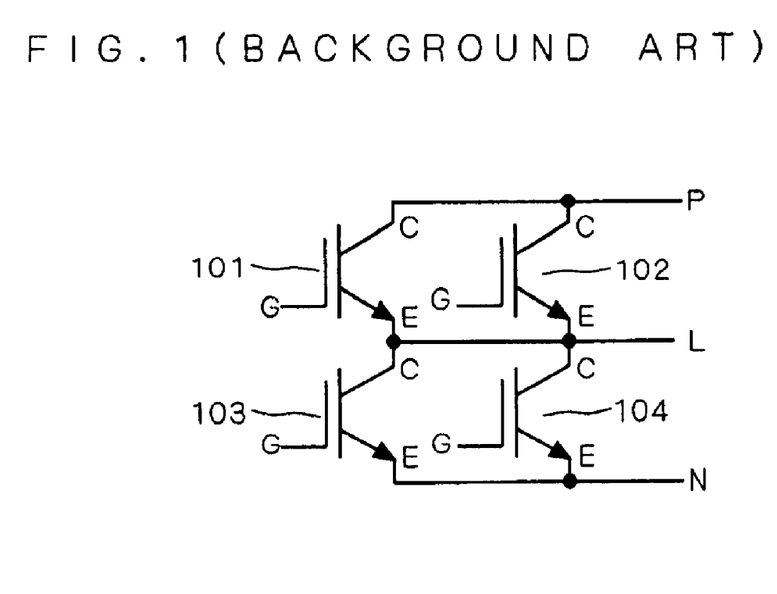
FIG. 1 shows a circuit configuration of a conventional power conversion device.

FIG. 1 shows a circuit configuration of the conventional power conversion device.

The power conversion device includes elements 101 to 104 each of which is the 1 in 1 type power module element sealed with resin by the transfer mold process and the like. The elements 101 to 104 have a gate electrode G, an emitter electrode E and a collector electrode C, respectively. As explained below, the elements 101 to 104 function as first to fourth resin-sealed switching elements of the present invention, respectively.

Collector electrodes Cs of the elements 101 and 102 are connected to a positive electrode P. Emitter electrodes Es of the elements 103 and 104 are connected to a negative electrode N. Emitter electrodes Es of the elements 101 and 102 and collector electrodes Cs of the elements 1;03 and 104 are connected to an intermediate electrode L. The intermediate electrode L inputs or outputs an intermediate potential between a potential of the positive electrode P and a potential of the negative electrode N. A target connection of the gate electrodes Gs is omitted here since it is barely directly pertinent to the present invention.

Figure 2:
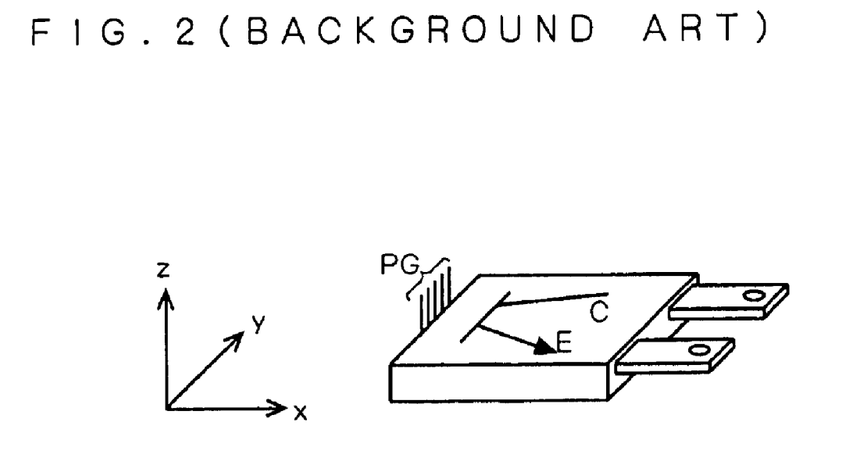
FIG. 2 shows a structure of an element used in the conventional power conversion device.

Each of the elements 101 to 104 has the same structure as shown in FIG. 2 and the same electric characteristics. In FIG. 2, the thickness direction of an element itself which is a rectangular parallelepiped is defined as "z", and an x axis and a y axis are defined to be parallel to each side perpendicular to the z axis. In FIG. 2, a control pin group PG containing a plurality of control pins extends in the z direction from one side (x=0) of the element itself. Additionally, a collector electrode C and an emitter electrode E both of which are made of conducting board extend in the x direction from the element itself. In FIG. 2, the y coordinates of the collector electrode C are greater than the y coordinates of the emitter electrode E. Here, it is assumed that one of the control pins of the control pin group PG corresponds to the gate electrode G in FIG. 1.

Figure 3:
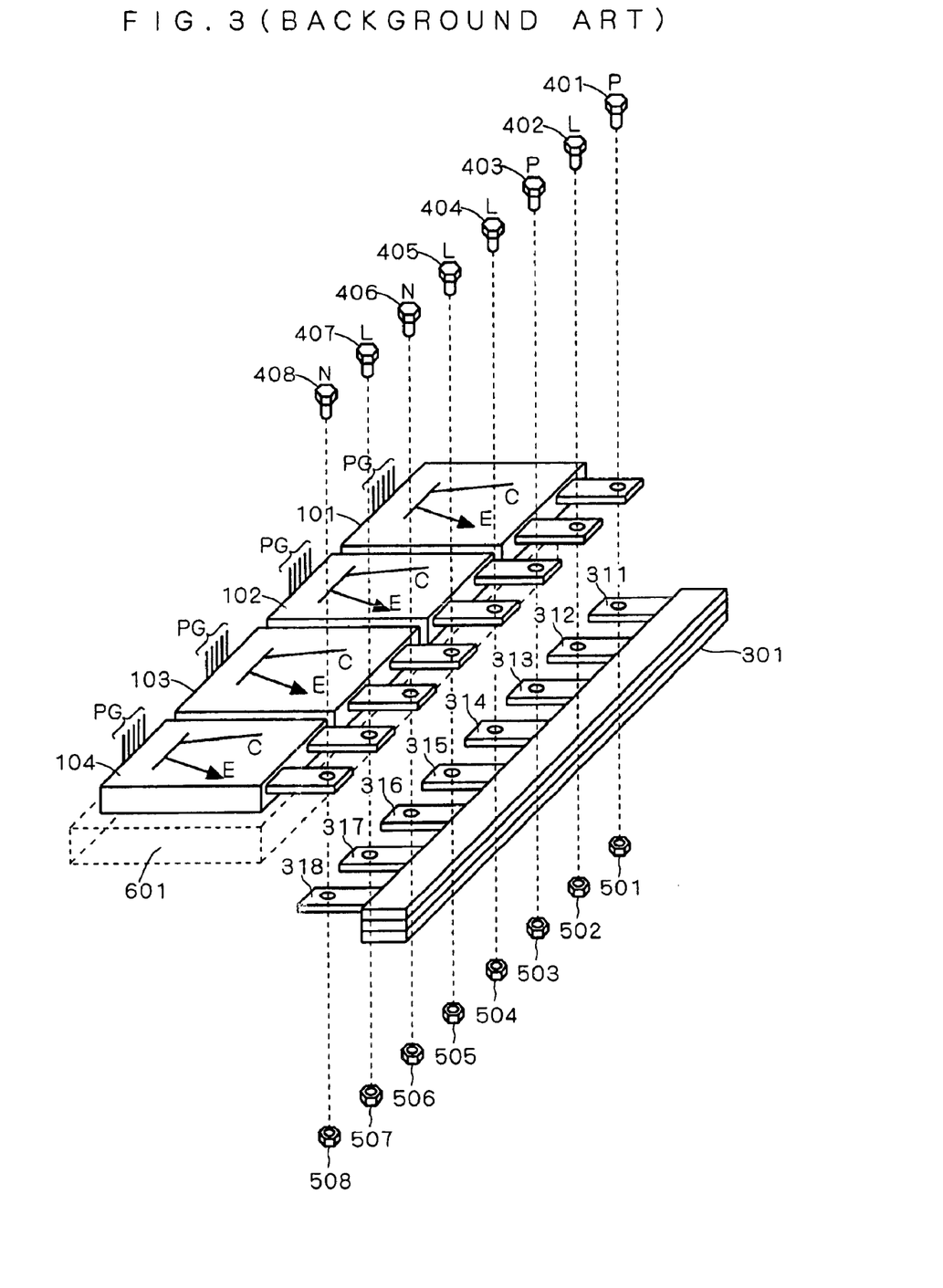
FIG. 3 is a perspective view showing an element configuration in the conventional power conversion device.

FIG. 3 is a perspective view showing a connection configuration of the elements which corresponds to the circuit configuration shown in FIG. 1.

In FIG. 3, the emitter electrodes Es and the collector electrodes Cs of the elements 101 to 104 are connected to bus electrodes 311 to 318 of a bus bar 301, respectively. The bus bar 301 contains seven layers including four insulating layers (not shown) and three conductive layers (shown) interposed between the insulating layers. The three conductive layers correspond to the aforementioned positive electrode P, the negative electrode N and the intermediate electrode L, respectively. Namely, each of the bus electrodes 311 to 318 is connected to one of the conductive layers corresponding to one of the positive electrode P, the negative electrode N and the intermediate electrode L.

The collector electrode C of the element 101 is connected to the bus electrode 311. The emitter electrode E of the element 101 is connected to the bus electrode 312. The collector electrode C of the element 102 is connected to the bus electrode 313. The emitter electrode E of the element 102 is connected to the bus electrode 314. The collector electrode C of the element 103 is connected to the bus electrode 315. The emitter electrode E of the element 103 is connected to the bus electrode 316. The collector electrode C of the element 104 is connected to the bus electrode 317. The emitter electrode E of the element 104 is connected to the bus electrode 318.

As shown in FIG. 3, the above connections to the elements 101 to 104 are established by bringing the electrodes to be connected into contact with each other, putting bolts 401 to 408 through bolt holes made in the electrodes, and fastening the bolts with nuts 501 to 508.

Then, the positive electrode P, the negative electrode N and the intermediate electrode L are connected to the three conductive layers of the bus bar 301, respectively, by externally using a bus bar, lead or the like. Consequently, the circuit configuration shown in FIG. 1 is realized.

Further, a surface of a cooling fin 601 comes into contact with the elements 101 to 104. The cooling fin 601 is arranged on a side (-z direction in FIG. 2) opposite to the control pin group PG of the elements 101 to 104 in order to avoid contact with the control pin group PG. Namely, in FIG. 3, the cooling fin 601 is arranged on the under side of the elements 101 to 104.

The conventional power conversion device, which is configured as discussed above, has presented a problem of an increase in wiring length in the bus bar and a corresponding increase in inductance. Another problem is an increase in the overall packaging area because of the four power module elements arranged on one side of the bus bar (when the elements 101 to 104 are sealed together with resin, the bus bar 301 is arranged outside the resin).

Figure 4:
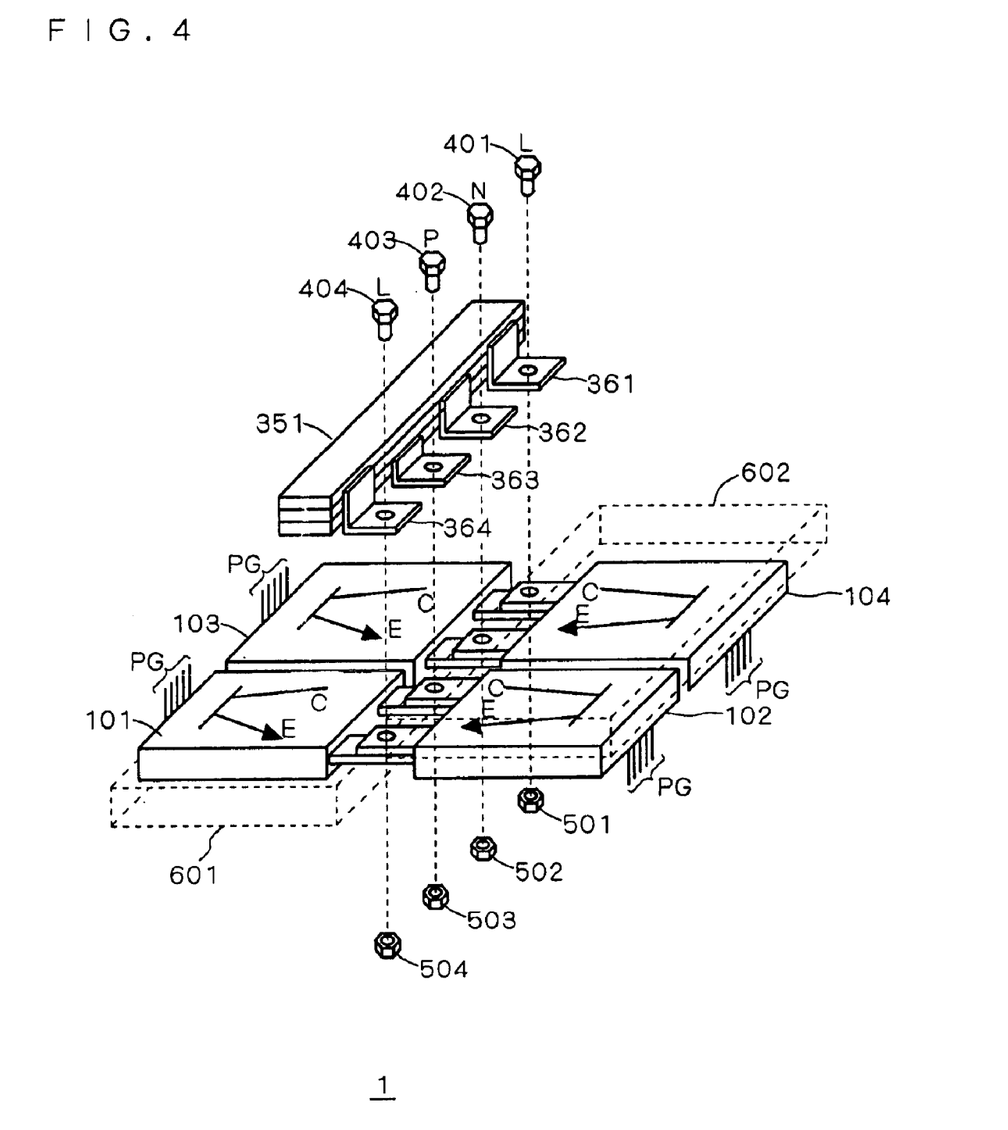
FIG. 4 is a perspective view showing a connection configuration of elements in a power conversion device 1 according to a first preferred embodiment of the invention.

FIG. 4 is a perspective view showing a connection configuration of elements in a power conversion device 1 as a power semiconductor device according to the first preferred embodiment. FIG. 4 differs from FIG. 3 in that a bus bar 351 having four bus electrodes 361 to 364 is used instead of the bus bar 301 having the eight bus electrodes 311 to 318. Namely, by arranging two elements each on both sides of the bus bar (making the elements face each other in twos with the bus bar between) rather than arranging four elements on one side of the bus bar, it becomes possible to connect electrodes of the two elements facing each other per one bus electrode. As explained below, the bus electrodes 361 to 364 function as first to fourth bus electrodes of the present invention, respectively.

In FIG. 4, the emitter electrodes Es and the collector electrodes Cs of the elements 101 to 104 are connected to the bus electrodes 361 to 364 of the bus bar 351, respectively.

As with the bus bar 301, the bus bar 351 contains seven layers including four insulating layers (not shown) and three conductive layers (shown) interposed between the insulating layers. Namely, each of the bus electrodes 361 to 364 is connected to one of the conductive layers corresponding to one of the positive electrode P, the negative electrode N and the intermediate electrode L.

In regard to the three conductive layers contained in the bus bar 351 shown in FIG. 4, the bus electrodes 361 and 364 are provided on a top layer to be connected to the intermediate electrode L. The bus electrode 362 is provided on a middle layer to be connected to the negative electrode N. The bus electrode 363 is provided on a bottom layer to be connected to the positive electrode P.

The collector electrodes Cs of the elements 103 and 104 are connected to the bus electrode 361. The emitter electrodes Es of the elements 103 and 104 are connected to the bus electrode 362. The collector electrodes Cs of the elements 101 and 102 are connected to the bus electrode 363. The emitter electrodes Es of the elements 101 and 102 are connected to the bus electrode 364.

As shown in FIG. 4, the above connections to the elements 101 to 104 are established by bringing the electrodes to be connected into contact with one another, putting the bolts 401 to 404 through bolt holes made in the electrodes, and fastening the bolts with the nuts 501 to 504.

Then, the positive electrode P, the negative electrode N and the intermediate electrode L are connected to the three conductive layers of the bus bar 351, respectively, by externally using a bus bar, lead or the like. Consequently, the circuit configuration shown in FIG. 1 is realized.

Further, the surface of the cooling fin 601 and a surface of a cooling fin 602 come into contact with the elements 101, 103 and the elements 102, 104, respectively. The cooling fins 601 and 602 are arranged on the side (-z direction in FIG. 2) opposite to the control pin group PG of the elements 101 to 104 in order to avoid contact with the control pin group PG. Namely, in FIG. 4, the cooling fin 601 is arranged on the under side of the elements 101 and 103, and the cooling fin 602 is arranged on the upper side of the elements 102 and 104.

In the connection configuration shown in FIG. 4, the number of the bus electrodes becomes fewer and the bus bar correspondingly gets shorter. Therefore, the wiring length thereby shortened allows a reduction in wiring inductance.

Further, since the number of the positive electrode P and the electrode N is one, respectively, the number of connection leads can be fewer with reference to FIG. 3. This allows a reduction in wiring inductance.

Still further, since the bus bar is arranged between the elements, a packaging area can be reduced (when the elements 101 to 104 are sealed together with resin, the bus bar 351 can also be sealed within the resin).

Moreover, in FIG. 4, the elements 101 and 102 are arranged on this side of the elements 103 and 104 so that the intermediate electrode L, the negative electrode N, the positive electrode P and the intermediate electrode L are connected in this order to the bus electrodes 361 to 364. Thus, the bolt 403 to be connected to the positive electrode P and the bolt 402 to be connected to the negative electrode N are adjacent to each other. Accordingly, in the case of connecting an up/down converter circuit or the like as a control circuit on the periphery of the elements 101 to 104, a connecting wiring inductance can be reduced (even if the elements 103 and 104 are arranged on this side of the elements 101 and 102, the circuit configuration shown in FIG. 1 may be realized. In this case, the positive electrode P, the intermediate electrode L, the intermediate electrode L and the negative electrode N are connected in this order to the bus electrodes 361 to 364).

As discussed above, the power conversion device 1 according to the present preferred embodiment has the effect of reducing the wiring inductance and the packaging area.

Figure 5:
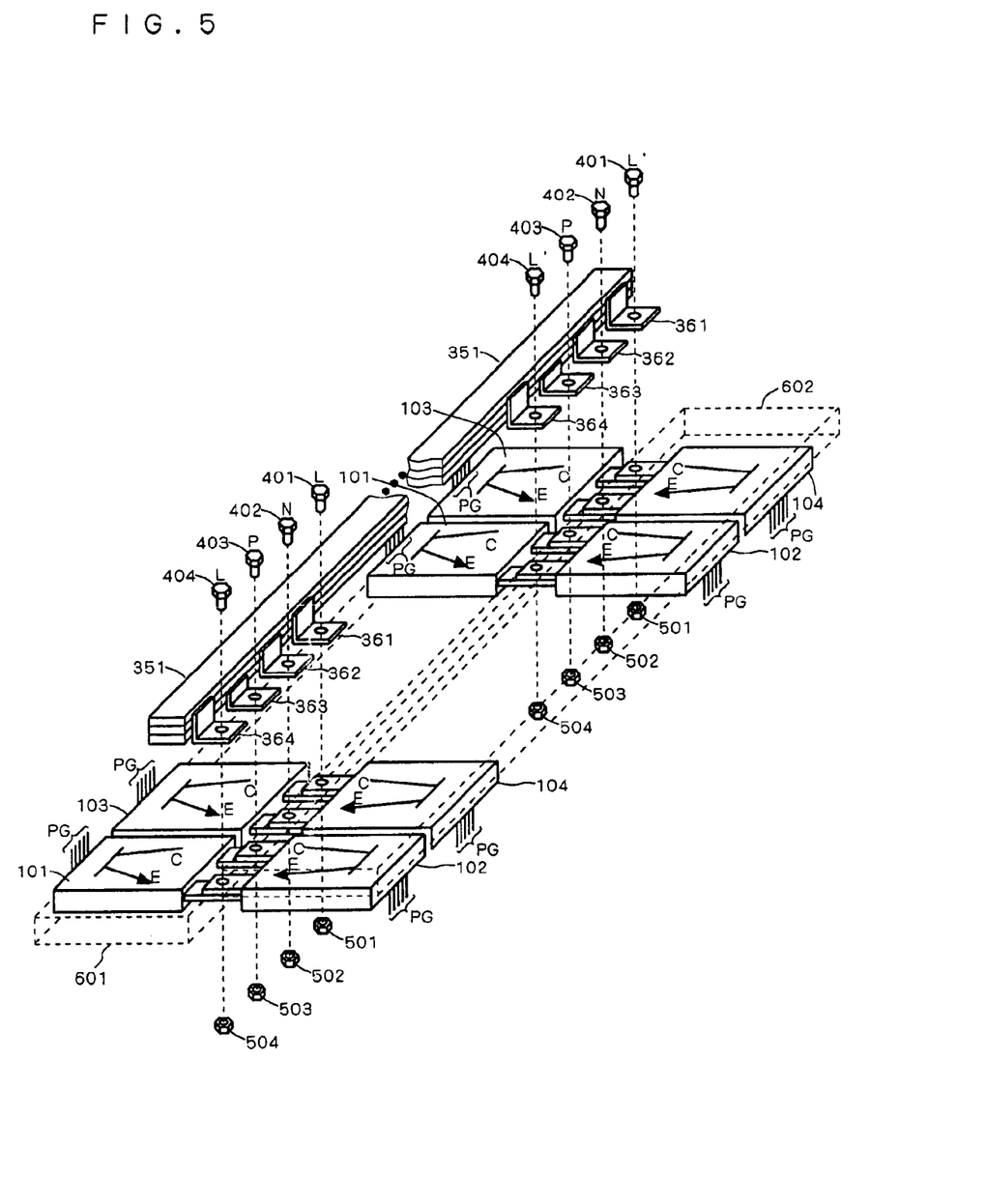
FIG. 5 is a perspective view showing a connection configuration of the elements in the power conversion device 1 according to the first preferred embodiment.

While the above explanation refers to a case where the number of the elements is four, the number of the elements may be greater than four as long as it is a multiple of four. As shown in FIG. 5, where the number of the elements is increased to eight, for example, the bus bar is extended and the additional four elements are connected to the bus bar in the same manner as above. In this case, the positive electrode P and the negative electrode N are commonly used for all the elements, while another intermediate electrode L' is used for the additional four elements besides the intermediate electrode L for the original four elements.

<Second Preferred Embodiment>

Figure 6:
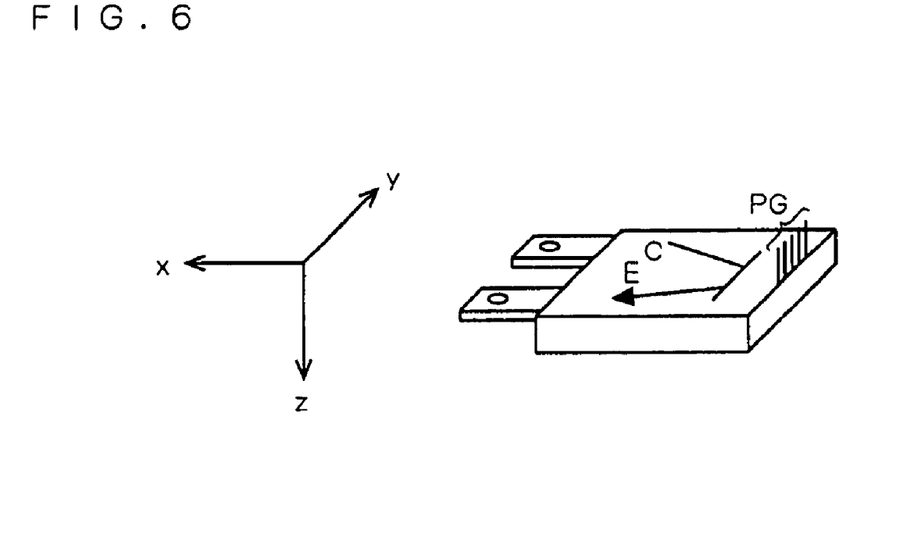
FIG. 6 shows a structure of an element used in a power conversion device 2 according to a second preferred embodiment of the invention.

In the power conversion device 1 according to the first preferred embodiment, which contains the elements 101 to 104 each of which has the same structure as shown in FIG. 2, the two cooling fins 601 and 602 are required. However, by replacing each of the elements 102 and 104 with an element having a structure as shown in FIG. 6, the number of the cooling fins can be reduced to one. The structure in FIG. 6 differs from the structure in FIG. 2 in that the control pin group PG extends in the opposite direction (-z direction), and has the same electric characteristics as those in FIG. 2.

Figure 7:
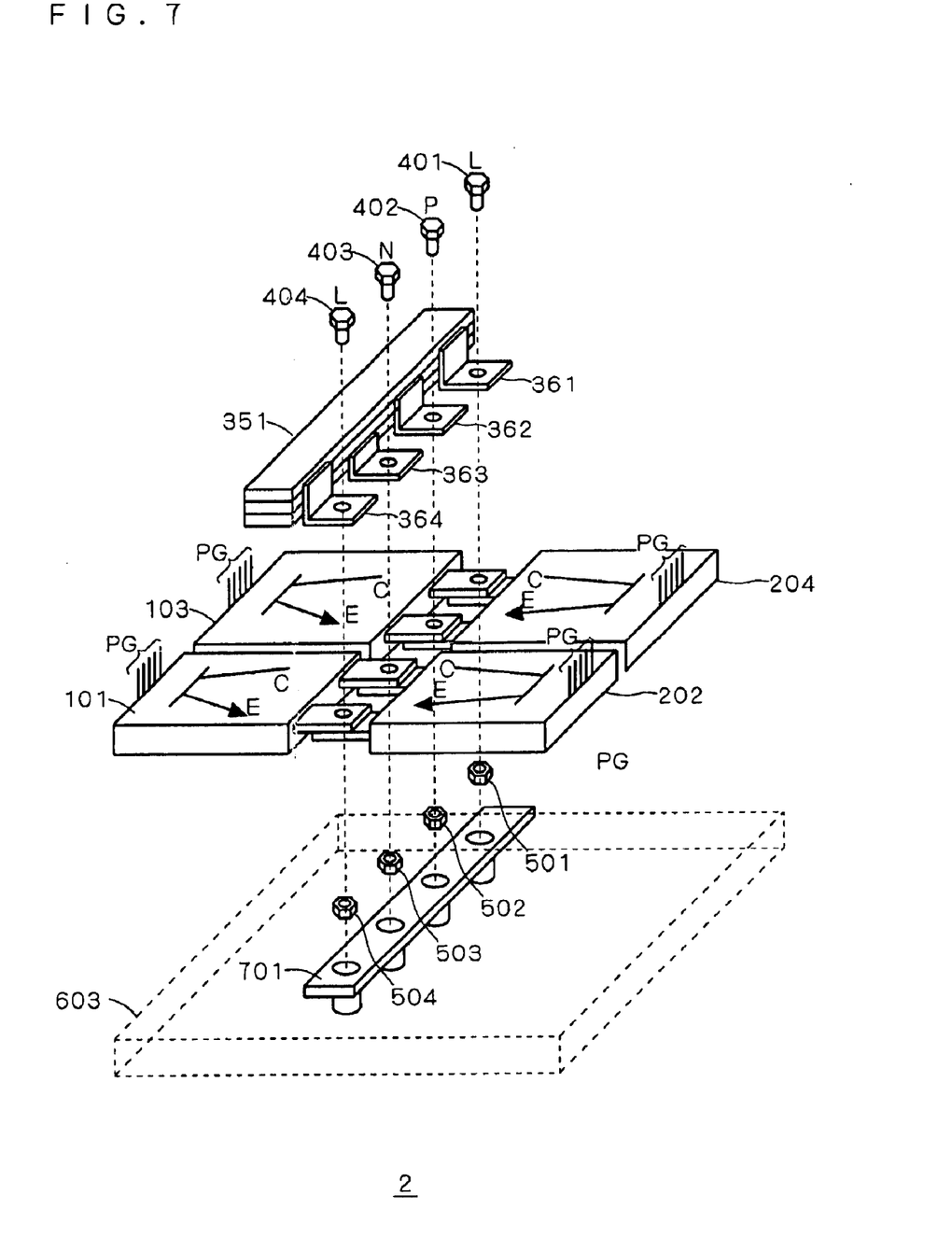
FIG. 7 is a perspective view showing a connection configuration of the elements in the power conversion device 2 according to the second preferred embodiment.

FIG. 7 is a perspective view showing a connection configuration of elements in a power conversion device 2 as a power semiconductor device according to a second preferred embodiment. The power conversion device 2 differs from the power conversion device 1 in FIG. 4 according to the first preferred embodiment in that the elements 102 and 104 are replaced with elements 202 and 204, respectively. In the power conversion device 2, the control pin groups PGs of the elements 101, 202, 103 and 204 extend in the same direction (upward). Therefore, it is possible to cool the four elements with one cooling fin 603 while keeping the cooling fin 603 from contact with the control pin groups PGs.

There are cases where tips of the bolts 401 to 404 and the nuts 501 to 504 come into contact with the cooling fin 603 depending on the shape of an element packaging. For this reason, as shown in FIG. 7, an insulating member 701 made of resin which has holes for storing the tips of the bolts 401 to 404 and the nuts 501 to 504 is used for ensuring insulation.

As discussed above, the power conversion device 2 according to the present preferred embodiment uses the one cooling fin 603 to cool the four elements. Therefore, the power conversion device 2 has the effect of simplifying the structure in addition to the effect of the first preferred embodiment.

<Third Preferred Embodiment>

Figure 8:
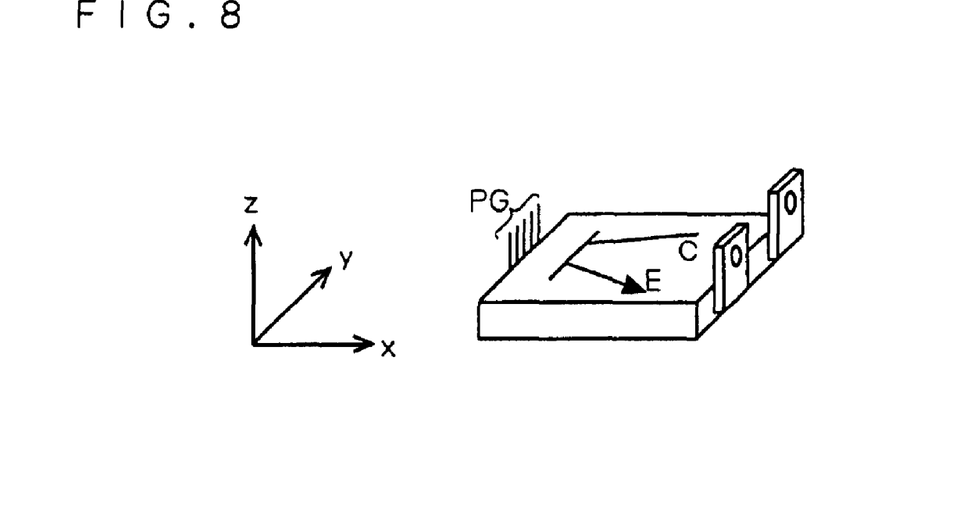
FIG. 8 shows a structure of an element used in a power conversion device 3 according to a third preferred embodiment of the invention.
Figure 9:
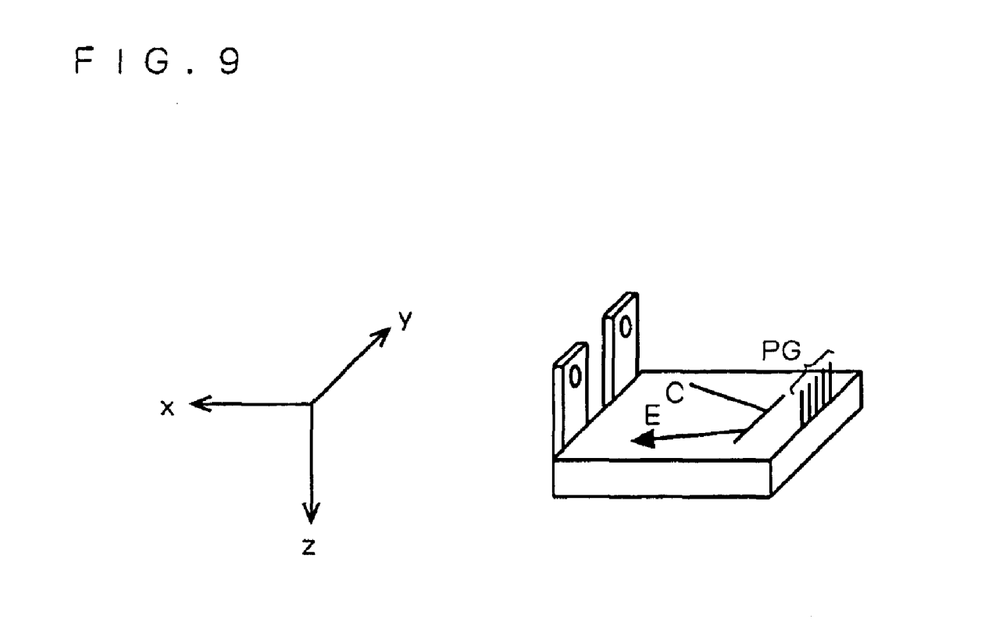
FIG. 9 shows a structure of an element used in the power conversion device 3 according to the third preferred embodiment.

In the first and second preferred embodiments, the element having the collector electrode C and the emitter electrode E extending in the x direction from the element itself as shown FIGS. 2 and 6 is used. Alternatively, elements 101a and 103a each of which has a structure as shown in FIG. 8 and elements 202a and 204a each of which has a structure as shown in FIG. 9 may be used instead. The structure in FIG. 8 differs from the structure in FIG. 2 in that the collector electrode C and the emitter electrode E extend in the z direction from the element itself, and has the same electric characteristics as those in FIG. 2. The structure in FIG. 9 differs from the structure in FIG. 6 in that the collector electrode C and the emitter electrode E extend in the -z direction from the element itself, and has the same electric characteristics as those in FIG. 6.

Figure 10:
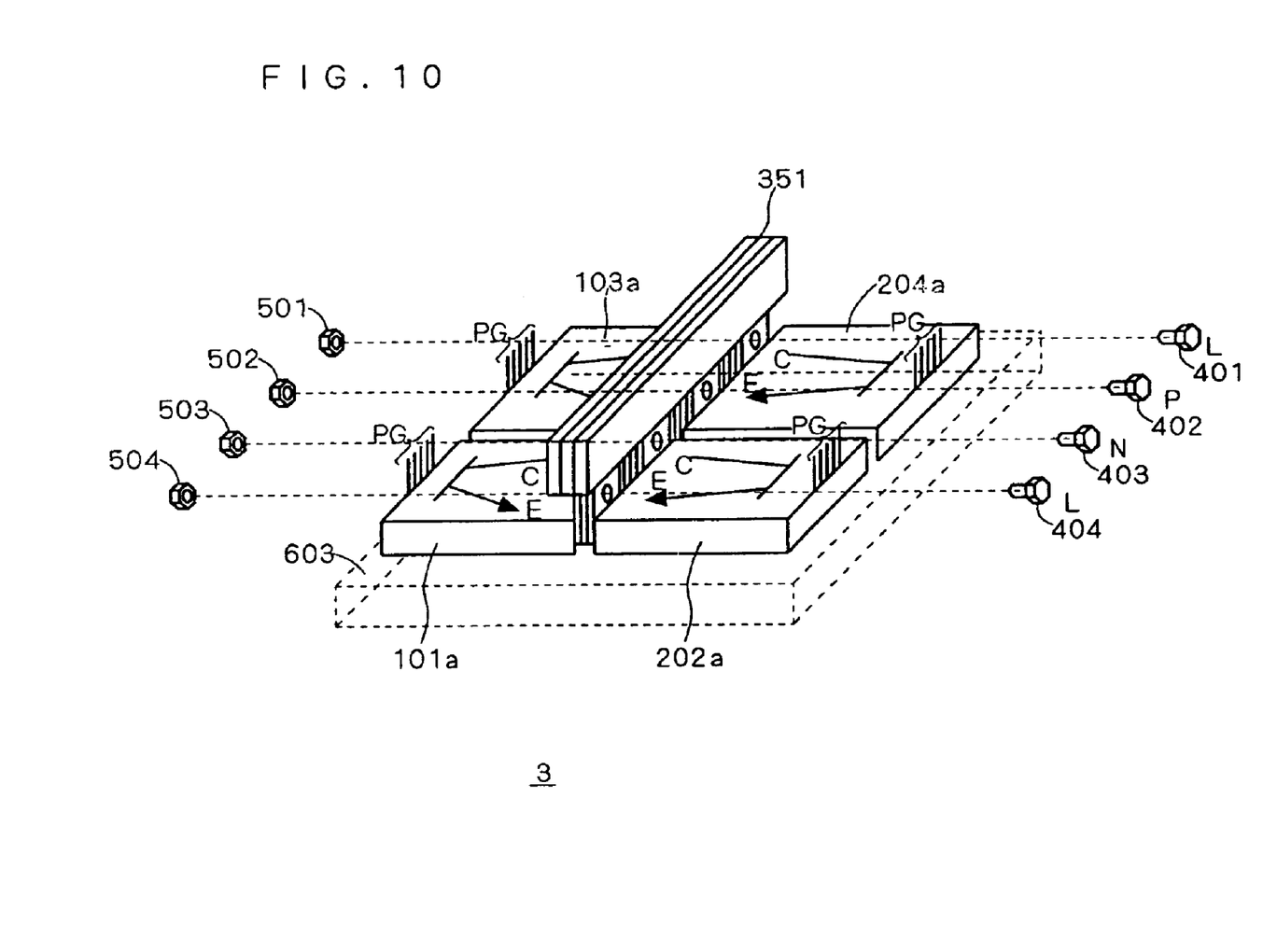
FIG. 10 is a perspective view showing a connection configuration of the elements in the power conversion device 3 according to the third preferred embodiment.

FIG. 10 is a perspective view showing a connection configuration of elements in a power conversion device 3 as a power semiconductor device according to a third preferred embodiment. The power conversion device 3 differs from the power conversion device 2 in FIG. 7 according to the second preferred embodiment in that the elements 101, 202, 103 and 204 are replaced with the elements 101a, 202a, 103a and 204a, respectively.

In the power conversion device 3, the collector electrodes Cs and the emitter electrodes Es extend in the same direction as the control pin groups PGs. Therefore, the tips of the bolts 401 to 404 and the nuts 501 to 504 are kept from contact with the cooling fin 603, thereby eliminating the use of the insulating member 701 made of resin.

Additionally, the distance between the collectors and the distance between the emitters of the elements facing each other with the bus bar 351 between become shorter, respectively (the electrode length's worth of distance becomes the electrode thickness' worth of distance). This allows a further reduction in wiring inductance.

As discussed above, in the power conversion device 3 according to the present preferred embodiment, the collector electrodes Cs and the emitter electrodes Es extend in the same direction as the control pin groups PGs from the elements themselves, and thus the tips of the bolts 401 to 404 and the nuts 501 to 504 are kept from contact with the cooling fin 603. Therefore, the power conversion device 3 has the effect of eliminating the use of the insulating member 701 made of resin.

Moreover, since the distance between the collector terminals Cs and the distance between the emitter terminals Es of the elements facing each other with the bus bar 351 between become shorter, respectively, the power conversion device 3 has the effect of further reducing the wiring inductance.

The power conversion devices 1 to 3 described above may enhance the insulating property by sealing the elements and the bus bar together with resin, respectively.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, comprising:
    a first resin-sealed switching element including a first gate electrode, a first emitter electrode and a first collector electrode;
    a second resin-sealed switching element including a second gate electrode, a second emitter electrode and a second collector electrode;
    a third resin-sealed switching element including a third gate electrode, a third emitter electrode and a third collector electrode;
    a fourth resin-sealed switching element including a fourth gate electrode, a fourth emitter electrode and a fourth collector electrode; and
    a bus bar having first to fourth bus electrodes provided thereon in this order, wherein
    said first resin-sealed switching element and said second resin-sealed switching element are arranged to face each other with said bus bar therebetween, and said third resin-sealed switching element and said fourth resin-sealed switching element are arranged to face each other with said bus bar therebetween,
    said first collector electrode and said second collector electrode are connected one over the other with said first bus electrode,
    said first emitter electrode and said second emitter electrode are connected one over the other with said second bus electrode,
    said third collector electrode and said fourth collector electrode are connected one over the other with said third bus electrode, and
    said third emitter electrode and said fourth emitter electrode are connected one over the other with said fourth bus electrode.

2. The power semiconductor device according to claim 1, wherein
    said first to fourth resin-sealed switching elements are arranged on a surface of a single cooling fin, and
    said first to fourth gate electrodes stand vertically with respect to said surface of said cooling fin.

3. The power semiconductor device according to claim 2, wherein
    said first to fourth emitter electrodes and said first to fourth collector electrodes stand vertically with respect to said surface of said cooling fin.

4. The power semiconductor device according to claim 1, wherein
    said second bus electrode is connected to a negative electrode,
    said third bus electrode is connected to a positive electrode, and
    said first bus electrode and said fourth bus electrode are connected to an intermediate electrode for inputting or outputting an intermediate potential between a potential of said negative electrode and a potential of said positive electrode.

5. The power semiconductor device according to claim 2, wherein
    said second bus electrode is connected to a negative electrode,
    said third bus electrode is connected to a positive electrode, and
    said first bus electrode and said fourth bus electrode are connected to an intermediate electrode for inputting or outputting an intermediate potential between a potential of said negative electrode and a potential of said positive electrode.

6. The power semiconductor device according to claim 3, wherein
    said second bus electrode is connected to a negative electrode,
    said third bus electrode is connected to a positive electrode, and
    said first bus electrode and said fourth bus electrode are connected to an intermediate electrode for inputting or outputting an intermediate potential between a potential of said negative electrode and a potential of said positive electrode.

7. A power semiconductor device, comprising:
    a first resin-sealed switching element including a first gate electrode, a first emitter electrode and a first collector electrode;

a second resin-sealed switching element including a second gate electrode, a second emitter electrode and a second collector electrode;

a third resin-sealed switching element including a third gate electrode, a third emitter electrode and a third collector electrode;

a fourth resin-sealed switching element including a fourth gate electrode, a fourth emitter electrode and a fourth collector electrode;

a bus bar having first to fourth bus electrodes provided thereon in this order; and a resin for sealing said first to fourth resin-sealed switching elements and said bus bar together, wherein said first resin-sealed switching element and said second resin-sealed switching element are arranged to face each other with said bus bar therebetween, and said third resin-sealed switching element and said fourth resin-sealed switching element are arranged to face each other with said bus bar therebetween, said first collector electrode and said second collector electrode are connected one over the other with said first bus electrode, said first emitter electrode and said second emitter electrode are connected one over the other with said second bus electrode, said third collector electrode and said fourth collector electrode are connected one over the other with said third bus electrode, and said third emitter electrode and said fourth emitter electrode are connected one over the other with said fourth bus electrode.

8. The power semiconductor device according to claim 7, wherein said first to fourth resin-sealed switching elements are arranged on a surface of a single cooling fin, and said first to fourth gate electrodes stand vertically with respect to said surface of said cooling fin.

9. The power semiconductor device according to claim 8, wherein said first to fourth emitter electrodes and said first to fourth collector electrodes stand vertically with respect to said surface of said cooling fin.

10. The power semiconductor device according to claim 7, wherein said second bus electrode is connected to a negative electrode, said third bus electrode is connected to a positive electrode, and said first bus electrode and said fourth bus electrode are connected to an intermediate electrode for inputting or outputting an intermediate potential between a potential of said negative electrode and a potential of said positive electrode.

11. The power semiconductor device according to claim 8, wherein said second bus electrode is connected to a negative electrode, said third bus electrode is connected to a positive electrode, and said first bus electrode and said fourth bus electrode are connected to an intermediate electrode for inputting or outputting an intermediate potential between a potential of said negative electrode and a potential of said positive electrode.

12. The power semiconductor device according to claim 9, wherein said second bus electrode is connected to a negative electrode, said third bus electrode is connected to a positive electrode, and said first bus electrode and said fourth bus electrode are connected to an intermediate electrode for inputting or outputting an intermediate potential between a potential of said negative electrode and a potential of said positive electrode.

* * * * *